(12) United States Patent
Kono

(10) Patent No.: US 7,940,544 B2
(45) Date of Patent: May 10, 2011

(54) MEMORY SYSTEM HAVING MULTIPLE VIAS AT JUNCTIONS BETWEEN TRACES

(75) Inventor: Fumihiro Kono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 12/432,942

(22) Filed: Apr. 30, 2009

(65) Prior Publication Data

US 2010/0277965 A1    Nov. 4, 2010

(51) Int. Cl.
*G11C 5/06* (2006.01)

(52) U.S. Cl. ............ 365/63; 716/126; 716/115; 29/825; 257/773; 257/750; 257/775; 257/776

(58) Field of Classification Search ............... 365/63; 716/126, 115; 29/825; 257/773, 750, 775, 257/776
See application file for complete search history.

(56) References Cited

U.S. PATENT DOCUMENTS

| | | | | |
|---|---|---|---|---|
| 5,841,688 A * | 11/1998 | Sukegawa et al. | ............... | 365/63 |
| 5,906,043 A * | 5/1999 | Lan et al. | ............... | 29/852 |
| 6,166,441 A * | 12/2000 | Geryk | ............... | 257/773 |
| 6,381,167 B2 * | 4/2002 | Ooishi et al. | ............... | 365/63 |
| 6,546,540 B1 * | 4/2003 | Igarashi et al. | ............... | 716/13 |
| 7,088,000 B2 * | 8/2006 | Cranmer et al. | ............... | 257/767 |
| 7,136,298 B2 * | 11/2006 | Frey | ............... | 365/158 |
| 7,205,876 B2 * | 4/2007 | Lee et al. | ............... | 336/200 |
| 7,787,289 B2 * | 8/2010 | Mani et al. | ............... | 365/158 |

OTHER PUBLICATIONS

Pille, et al., "Implem. of the CELL Broadband Engine in a 65nm SOI Tech. Featuring Dual-Supply SRAM Arrays Supporting 6GHz at 1.3V", 2007 IEEE Int'l Solid State Circuits Conf.

* cited by examiner

*Primary Examiner* — Viet Q Nguyen
(74) *Attorney, Agent, or Firm* — Law Offices of Mark L. Berrier

(57) ABSTRACT

An improvement to a memory system having a hierarchical bitline structure wherein traces that form global write lines are connected to each other using junctions that include multiple vias to reduce capacitance and increase yield. At least one of a pair of traces connected by the vias includes a widened portion that provides sufficient overlap with the other trace to allow the two or more vias to be formed between the traces at the overlap. Parallel traces for global write lines that carry a write signal and its inverse may be positioned more than one maximum-density grid space apart to allow the widened portions to be formed between the traces. A global read line that is formed in a different metal layer from the global write line traces may be positioned in a grid space between the global write line traces to reduce the capacitance of this line.

18 Claims, 6 Drawing Sheets

MEMORY SYSTEM HAVING MULTIPLE VIAS AT JUNCTIONS BETWEEN TRACES

BACKGROUND

1. Field of the Invention

The invention relates generally to memory systems, and more particularly to systems and methods for reducing the capacitance associated with certain memory systems thereby increasing the speed with which memory cells can be read and reducing the power required by the memory system.

2. Related Art

There is a continuing demand in the design of electronic circuits for increased computational power and decreased size and power consumption. These goals are achieved in various ways, such as by improving the physical characteristics of the devices. For example, computational power may be increased by developing components that can operate at higher clock speeds than previous components. Device size may be reduced by using technologies that allow smaller features to be constructed on an integrated circuit die. Lower power consumption may be achieved by using lower power supply voltages. Many other techniques are also used to meet these demands.

There are, however, physical limitations to some of these techniques. For instance, the frequency of the clock signal used in a digital circuit cannot be increased beyond the point at which the components that use the clock signal become unstable. Similarly, a power supply voltage cannot be reduced to a level at which the components operating on this supply voltage no longer function properly, and the physical size of a circuit components cannot be reduced to a size which is too small to be resolved using available process technologies. It is therefore necessary to find better ways to take advantage of the available technologies.

Once such way of taking advantage of available technologies in the context of memory devices is the use of a hierarchical bit line scheme to read SRAM memory cells. In a conventional system, many SRAM cells (see, e.g., 128 in FIG. 1) might be connected to a single, common bit line. Typically, there is a small amount of leakage current between each SRAM cell and the bit line. As a result of the current leaks in all of the cells connected to the bit line, it can be difficult to reliably read data from a single one of the cells. Hierarchical bit line schemes were developed to allow the SRAM cells to be grouped together in smaller numbers so that each cell could be reliably read, despite the leakage from the smaller number of cells.

In a conventional hierarchical bit line scheme, a first group of cells (16, for example) is coupled to a first bit line, while a second group of cells of the same number is coupled to a second bit line. Each of the bit lines is input to an evaluation circuit. The outputs of multiple evaluation circuits are then input to further evaluation circuitry. In this manner, a number of cells equivalent to a conventional system (e.g., 128 cells) can be read, even though the cells are grouped into smaller numbers (e.g., 16) on each common bit line.

Even this hierarchical bit line scheme can be improved, however. Because of the connections between metal traces that form the system and the close proximity of some of the traces in the conventional system, there is capacitance which reduces the maximum speed at which the cells can be operated and also increases the power required to operate the cells. Additionally, the vias that connect the traces may fail, causing the memory cells to fail.

It would therefore be desirable to configure the memory cells so that the capacitance in the memory cells is reduced, thereby increasing the speed at which the cells can be operated and reducing the power required by the cells. It would also be desirable to reduce failures in the vias, thereby increasing the yield of the memory cells.

SUMMARY OF THE INVENTION

One or more of the problems outlined above may be solved by the various embodiments of the invention.

Broadly speaking, the invention includes systems and methods for reducing the failures and capacitance associated with certain memory systems, thereby increasing the yield of the memory cells, increasing the speed with which memory cells can be read and reducing the power required by the memory system.

In one embodiment, a memory system having a hierarchical bitline structure includes an improvement wherein traces that form global write lines are connected to each other using junctions that include multiple vias, thereby reducing the capacitance associated with these lines. Further, if one of the vias fails, the remaining via(s) still provide a good connection between traces. At least one of a pair of traces connected by the vias includes a widened portion that provides sufficient overlap with the other of the pair of traces to allow the two or more vias to be formed between the traces at the overlap. Parallel traces for global write lines that carry a write signal and its inverse may be positioned more than one maximum-density grid space apart to allow the widened portions to be formed between the traces. A global read line that is formed in a different metal layer from the global write line traces may be positioned in a grid space between the global write line traces to reduce the capacitance of this line.

One embodiment comprises an improvement to a memory system that has a hierarchical bitline structure. This structure includes a first global write line configured to carry a first global write signal and a second global write line configured to carry a second global write signal that is the inverse of the first global write signal. Each of the global write lines includes multiple traces in different metal layers of the IC in which the memory system is implemented. Traces that form each global write line are connected at junctions. One or more of these junctions include multiple vias between the respective metal layers, rather than a single via as is found in conventional structures. At each junction, one of the traces is widened to increase the overlap between the traces. The overlap is increased to accommodate the multiple vias.

In one embodiment, traces of two different global write lines are formed next to each other in the same metal layer. The traces are not positioned at the minimum spacing allowable, but are separated to provide additional space between them. The traces are widened by forming bumpouts that extend into the space between the traces. The bumpouts provide the additional overlap between these traces and traces in a different metal layer so that multiple-via junctions can be formed between the traces in the different metal layers. The space can also be used to position a global read line (which is in a different metal layer from the global write lines), which may reduce the capacitance of the global read line.

Numerous additional embodiments are also possible.

The various embodiments of the present invention may provide a number of advantages over the prior art. In particular, the present systems and methods may reduce the capacitance of lines such as the global write lines of a memory system utilizing a hierarchical bit line scheme, thereby increasing their access speed in comparison to conventionally configured systems. The present systems and methods may also increase the yield of memory cells because the additional vias in a connection between traces may maintain a good connection even when one of the vias fails. The present systems and methods may also read reduce the capacitance of a global read line of a hierarchical bit line memory system, resulting in increased access speed. The reductions in capacitance using the present systems and methods may also result in reduced power consumption.

BRIEF DESCRIPTION OF THE DRAWINGS

Other objects and advantages of the invention may become apparent upon reading the following detailed description and upon reference to the accompanying drawings.

Figure 1:
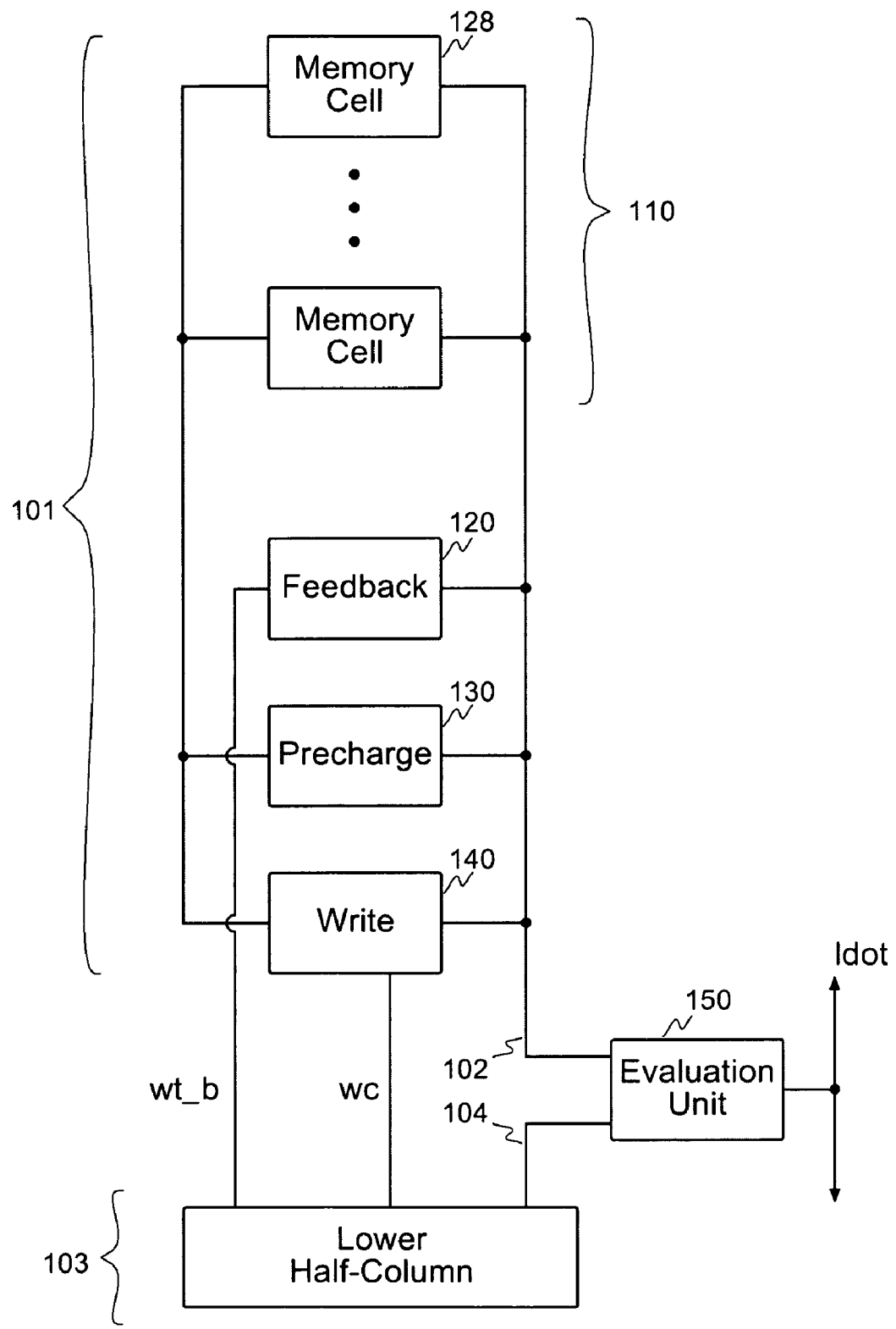
FIG. 1 is a schematic of a conventional memory system.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for increasing the yield and reducing the capacitance associated with memory system circuits, thereby potentially increasing the speed and reducing the power required by these systems. More particularly, the system is improved by introducing additional vias between the traces of different metal layers.

An exemplary embodiment is implemented in a memory system that uses a hierarchical bit line scheme. The capacitance of some of the lines in the memory system can be reduced by adding vias between metal layers. In one embodiment, a set of SRAM memory cells is organized in an array wherein each cell is accessed/read by a bit line. Each memory cell is connected to the bit line at a corresponding junction. Each junction connects traces in two different metal layers and thereby connects the bit line and memory cell. The circuit speed can be limited by the capacitance associated with this junction. By reducing this junction capacitance, the read delay and power consumption of the memory cell can be reduced. Thus, rather than using a single connecting via to make the junction, multiple vias are used. In particular, where there is a junction between a trace in one layer and a trace in another layer, one of the traces is repositioned and widened, and two vias are formed at the junction instead of only one. The additional via also increases the yield of the memory cells. Even though the failure rate of vias is very low (e.g., 1 in 1,000,000), there are millions of vias in a memory system, so the additional via maintains a good connection between traces, even when the other via fails.

Before describing the exemplary embodiments of the invention in detail, it will be helpful to describe a conventional memory configuration including memory cells and accompanying circuitry. In one embodiment, a set of SRAM memory cells is organized as an array having multiple rows and columns using a hierarchical bit line scheme. Each column has an upper half and a lower half. Each half-column has its own common bit line.

Figure 2:
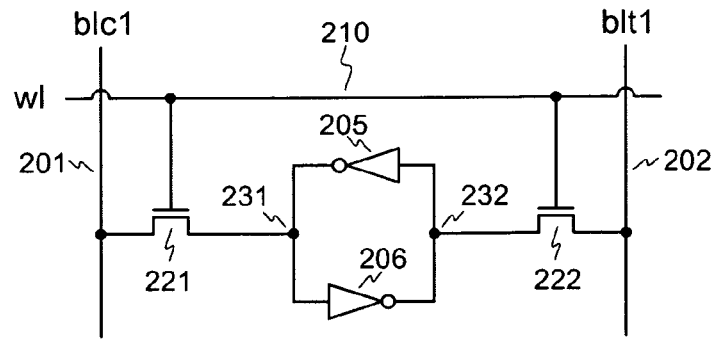
FIG. 2 is a diagram of a conventional memory cell.
Figure 3:
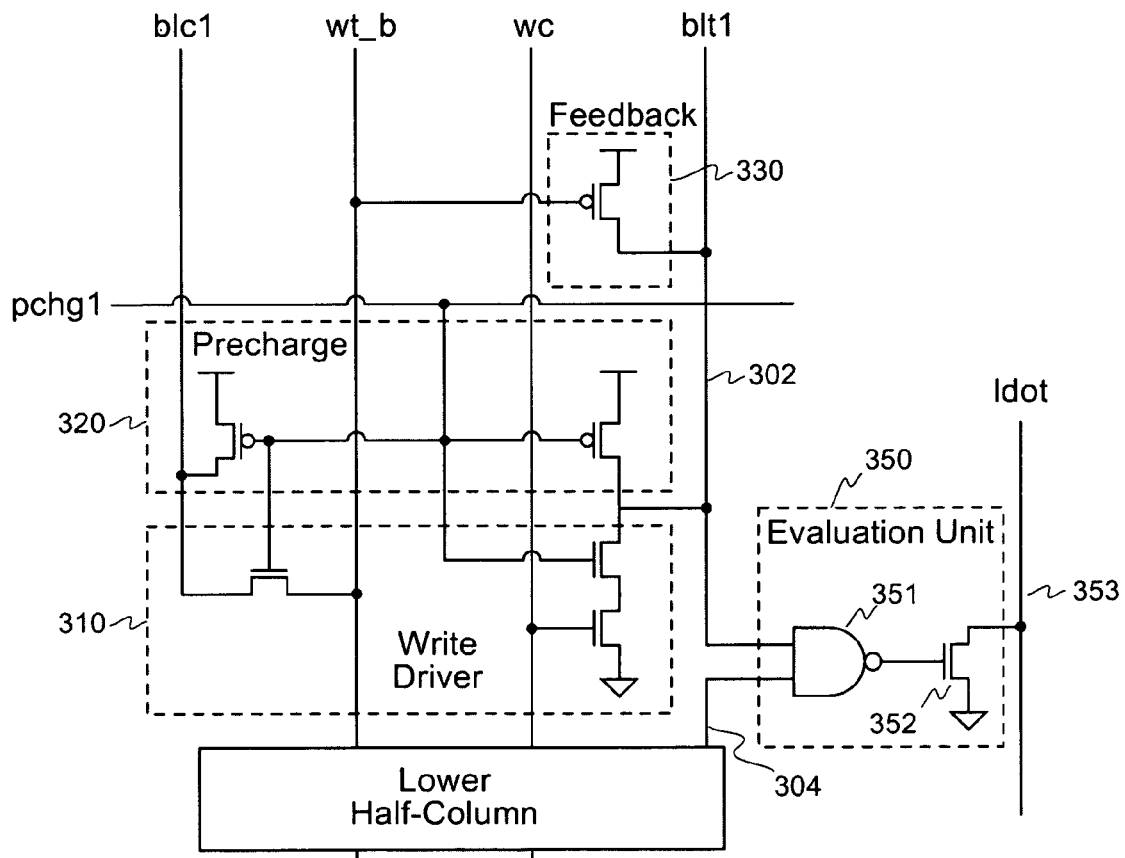
FIG. 3 is a diagram of a conventional memory system.

Referring to FIG. 1, a diagram illustrating a portion of a memory system implementing a hierarchical bit line scheme is shown. This figure illustrates one column of the memory array, having two halves: upper half 101 and lower half 103. The detail of the upper half shows SRAM memory cells 110, feedback circuitry 120, precharge circuitry 130, and write circuitry 140. Each of the SRAM cells in a half-column is connected to evaluation circuitry 150 by a bit line associated with that half-column. The upper half (101) of the column includes bit line 102, while the lower half (103) of the column includes bit line 104. FIGS. 2 and 3 show an exemplary circuit in greater detail.

Illustrated in FIG. 2 is a schematic of a memory cell using a conventional six-transistor configuration. In this configuration, four transistors form a pair of inverters (205, 206) that store a data bit. The nodes (231, 232) between the inverters maintain voltages corresponding to the data bit and its inverse. The data bit is stored at node 232, while the inverse of the data bit is stored at node 231. The nodes between the inverters (231, 232) are selectively connected to common bit lines 201 and 202 through connecting transistors 221 and 222, respectively.

Each memory cell in a column is associated with a different word line and only one word line is active at any given time. The word line is connected to the gates of connecting transistors 221 and 222. Connecting transistors 221 and 222 are thereby switched on and off according to the signal on word line 210. To read the memory cell, the signal on word line 210 is asserted, connecting node 232 of the cell to bit line 202 through connecting transistor 222. As noted above, bit line 202 is connected to a local evaluation unit, which is connected to a global bit line.

Each column of the memory cell array includes a local evaluation circuit. During a read cycle, the evaluation circuit determines whether the bit read from the active cell among those in the two half-columns is a 1 or a 0.

Referring to FIG. 3, local evaluation circuit 350 has two inputs which are connected to the common bit lines of the two half-columns and the output is connected to global bit line 353. Evaluation circuit 350 consists of NAND gate 351 and NMOS transistor 352. The two evaluation inputs (bit lines 302 and 304) are connected to NAND gate 351, the output of which is connected to the gate of transistor 352. The source of NMOS transistor 352 is coupled to precharged global bit line 353, while the drain of the transistor is coupled to ground. The evaluation circuit therefore acts in the same manner as an AND gate (i.e., the global bit line is high when the selected memory cell is high, and is low otherwise.)

In addition to the evaluation circuit that reads the memory cells, the system includes a write driver 310, a precharge circuit 320 and a feedback circuit 330. Write driver 310 receives global write signals wc and wt_b, and selectively drives the bit lines to either 1 or 0 to write the appropriate bits into the memory cells. Precharge circuit 320 precharges the bit lines to 1 between memory accesses in order to prepare the bit lines for these accesses. Feedback circuit 330 helps maintain bit line signal blt1 at 1 when write signal wt_b is 0 during a write 1 operation.

When the memory cells in a column are read, a selected cell is coupled to the common bit line in that half-column. Bit lines 353, 302, and 304 are initially precharged to Vdd. If the memory cell being read contains a 0, its bit line (302 or 304) is pulled low, while the other bit line remains high. The inputs to NAND gate 351 will therefore be a 0 and a 1, causing the output of the NAND gate to be 1. This switches transistor 352 on, discharging precharged global bit line 353. Global bit line 353 will then be read as a 0.

If, on the other hand, the memory cell contains a 1, both the bit line connected to the active memory cell and the bit line for the other half-column (302 and 304) will remain high. The inputs to NAND gate 351 will therefore both be high. Because the inputs to NAND gate 351 will both be 1, the output of the NAND gate will be 0, which switches off transistor 352. The precharged global bit line 353 will then remain high and will be read as a 1.

Figure 4:
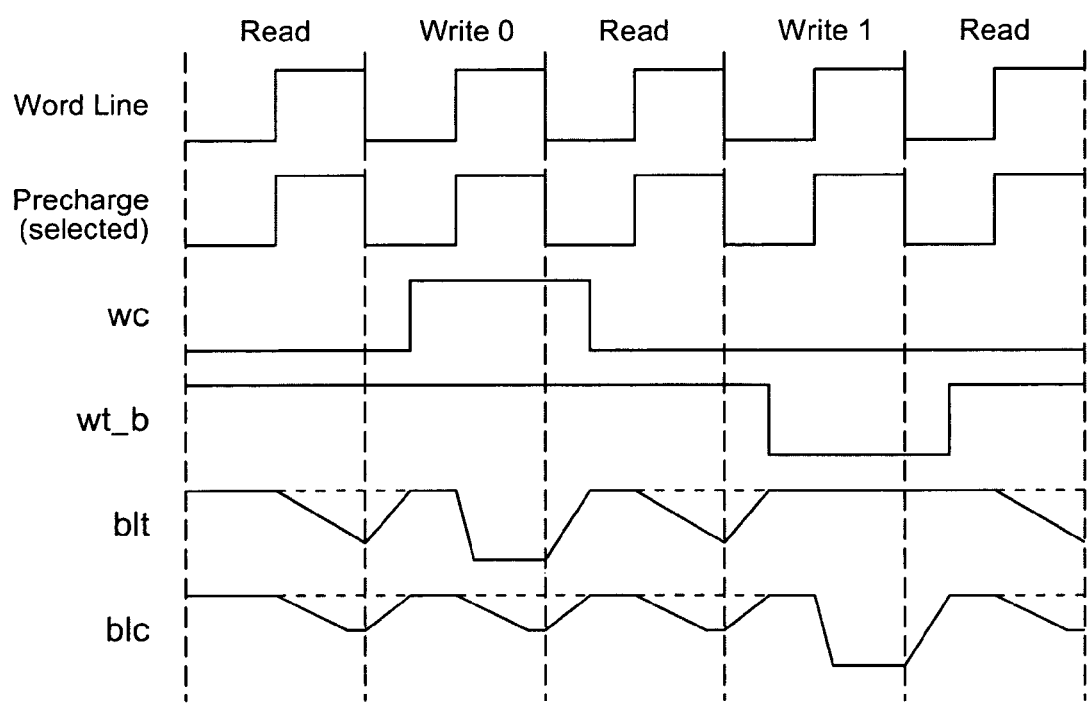
FIG. 4 is an exemplary plot of voltages in a conventional memory system.

FIG. 4 is a plot of the signals associated with the word line, write lines and bit lines illustrated in FIG. 2 and FIG. 3. These signals are illustrated for both read accesses and write accesses. Both write 0 and write 1 accesses are shown.

Integrated circuits (IC's) are fabricated using various types of overlapping layers (e.g., diffusion, implant polysilicon, metal). The IC's components can be constructed using a number of techniques to incorporate combinations of these layers. Random access memory is among the most regular and densest of IC's. Conventionally, the components are laid out on a rectangular grid. This grid may be referred to as a maximum-density grid, as will be explained in more detail below. Components formed in the IC are interconnected by traces (metal strips) formed of metal in the metal layers, typically along the lines of the rectangular grid. The traces are interconnected by conductive vias that extend from one metal layer to another.

Figure 5:
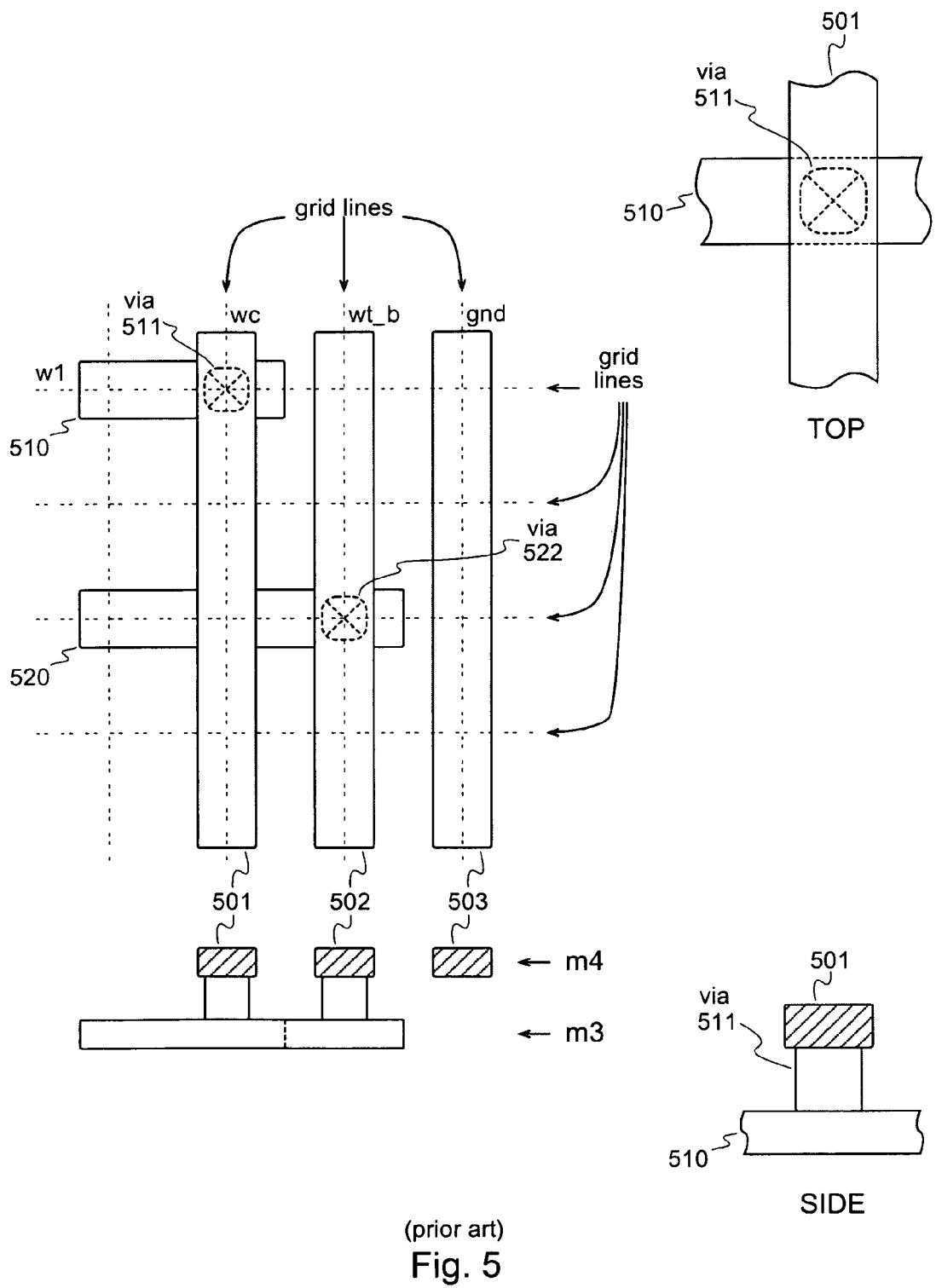
FIG. 5 is a schematic of vias connecting traces in a conventional memory system.

Illustrated in FIG. 5 is schematic of vias connecting traces as in a conventional memory system. Shown are two "horizontal" (510, 520) and three "vertical" traces (501, 502, 503) aligned with a grid. Each of two pairs of traces are connected at the illustrated junctions. The connected traces are on different layers (see side view) and the junctions are constructed at points where the traces cross over each other (see top view). This allows for the vias (which are orthogonal to the metal layers) to fall within the bounds of each of the traces (see top view via 511). A via connecting two layers/traces can be constructed by forming a hole through the intervening layers (perpendicular to the layers) and subsequently filling the hole with solder.

The circuits of FIG. 2 and FIG. 3 are constructed by forming the circuit components and connecting wires in the various layers of the IC. The manner in which the connecting wires are formed is the focus of the present disclosure. More specifically, the disclosure concerns the connections between traces in the different metal layers and the positioning of some of the traces so that the capacitance associated with some of the lines is reduced, thereby enhancing the performance of the circuits. The disclosed connections also increase yields by maintaining good connections between traces. FIG. 5 illustrates the conventional construction of connections between traces in the M3 and M4 metal layers of the IC which form the global write lines that carry write signals wc and wt_b.

In the conventional configuration of FIG. 5, each of the junctions between traces is formed using a single via. This single via presents an amount of capacitance that limits the performance of the system by delaying signals that traverse the junction. The system's performance, however, can be improved. In the present system, the system performance is improved by reduced by reducing the junction capacitance and thereby reducing circuit delay. This is accomplished by using junctions having more than the usual single via. Further, by having multiple vias in each of these junctions, the junctions still provide good connections between the traces, even when one of the vias in a junction fails.

In FIG. 5, traces 501 and 502 are used for global write lines wc and wt_b, respectively, are positioned immediately adjacent to each other. That is, they occupy successive vertical grid lines. (The grid lines are shown as dotted lines in the figure.) Trace 501 is connected to trace 510 at a junction that is formed by a single via 511. Thus, traces 501 and 510 both form segments of the global write line that carries signal wc. Trace 502 is connected to trace 520 at a second junction that is formed by a single via 522. Traces 502 and 520 therefore form segments of the global write line that carries signal wt_b. Trace 503 is used in this embodiment for ground.

The performance of the memory system can be improved by using junctions having more than the usual single via. This new configuration reduces the capacitance associated with the junctions and thereby reduces the signal delays associated with the junctions. The traces are positioned farther apart than in the conventional configuration to accommodate widened portions, or "bumpouts", which in turn accommodate the additional vias of the junctions.

Figure 6:
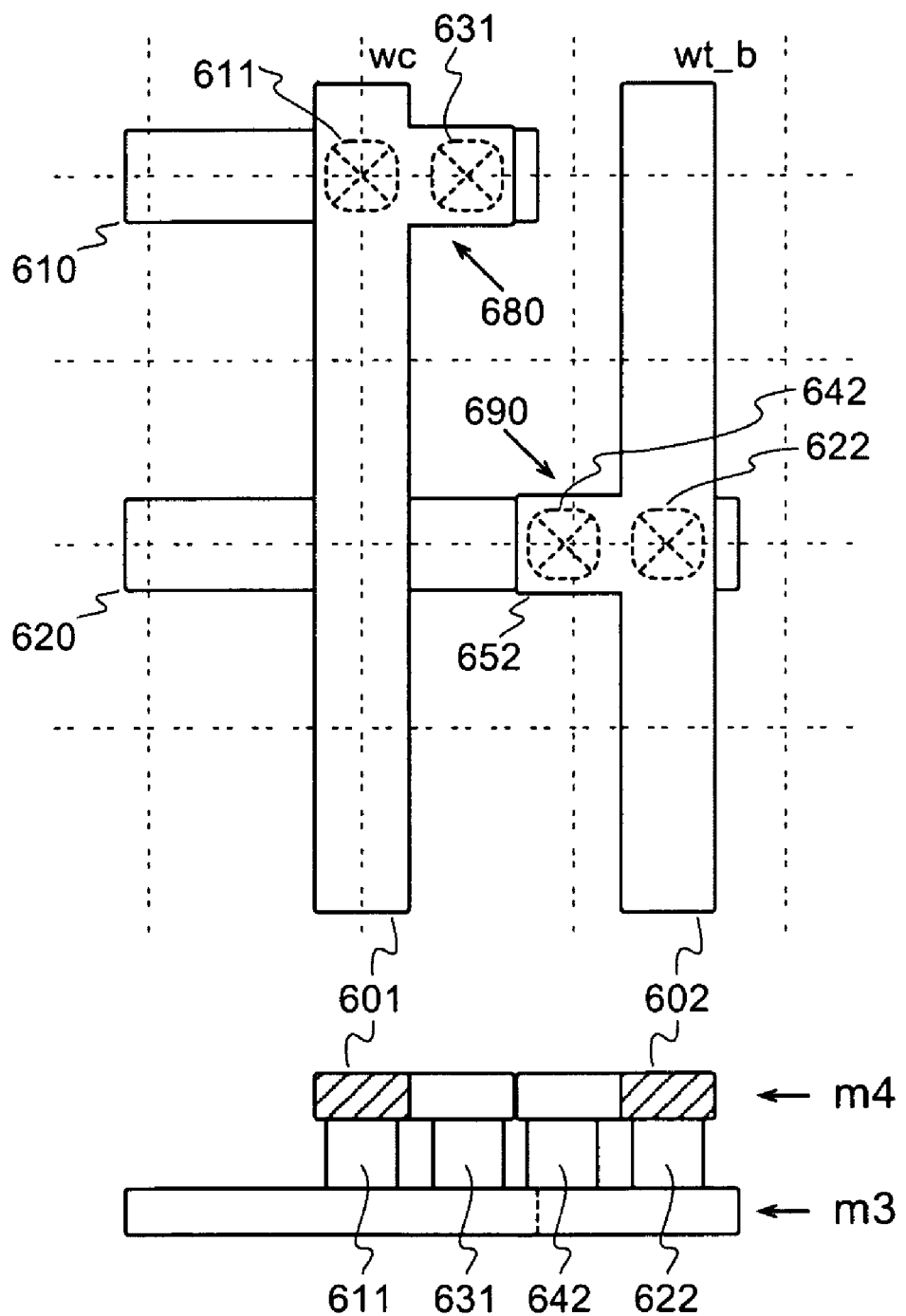
FIG. 6 is a schematic of vias connecting traces in a memory system as in one embodiment.

Referring to FIG. 6, a diagram illustrating the structure of the junctions in an exemplary embodiment is shown. Illustrated are two "horizontal" traces (610, 620) and two "vertical" traces (601, 602). As in FIG. 5, the traces that correspond to line wc (601, 610) are connected at a first junction 680 and the traces that correspond to line wt_b (602, 620) are connected at a second junction 690.

Again, the connected traces are on different layers (see side view) and the junctions are constructed at points where the traces cross over each other (see top view). However, in this embodiment, the junctions each consist of two vias that are substantially adjacent to each other. For example, junction 680 includes vias 611 and 631, while junction 690 includes vias 622 and 642. Because the overlap of conventionally positioned and sized traces is not sufficiently large to accommodate two vias, one of the traces in each pair is widened by including a "bumpout" that extends perpendicularly from the trace (parallel to the other trace). Bumpout 651 of trace 601 provides enough overlap with trace 610 to allow both of vias 611 and 631 to be formed between these traces.

As noted above, traces are normally formed on a grid that is defined by the minimum feature size of the IC components. This minimum feature size is generally defined by the process technology that is employed in the manufacture of the IC. Parallel traces are conventionally formed on adjacent lines of this grid in order to achieve the maximum circuit density that is possible using the employed process technology. When the bumpouts described above are required, however, the traces cannot be formed on adjacent lines of this maximum-density grid because the bumpouts can cause electrical shorts between the traces. The traces must therefore be positioned more than one grid-space (the distance between adjacent parallel grid lines) apart. In the embodiment of FIG. 6, the traces are approximately 1.5 maximum-density grid-spaces apart. Bumpouts 651 and 652 on traces 601 and 602 are formed in the additional space between traces 601 and 602.

Figure 7:
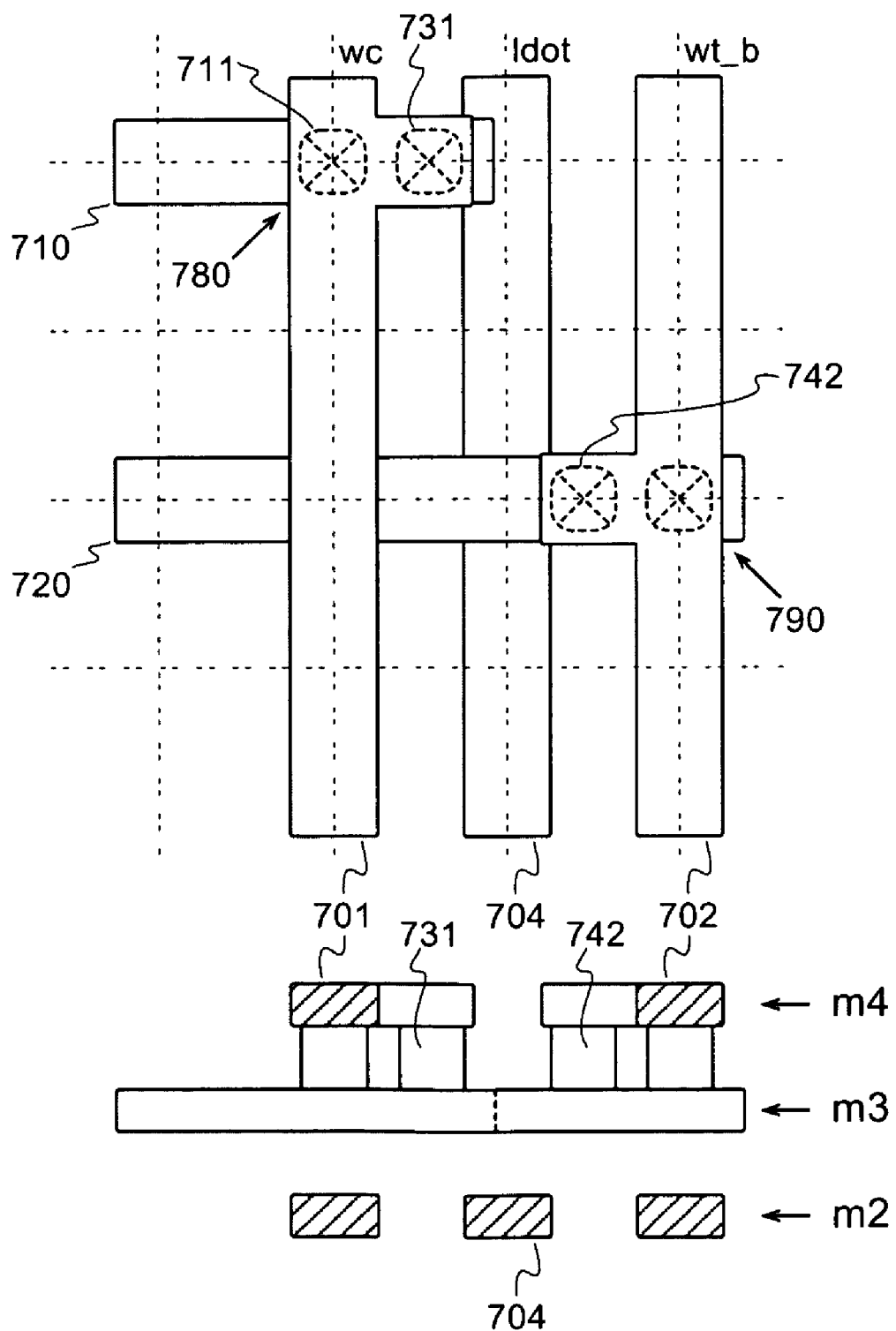
FIG. 7 is a schematic of vias connecting traces in a memory system as in one embodiment.

Referring to FIG. 7, a diagram illustrating an alternative configuration of the traces of a memory system using a hierarchical bit line scheme is shown. This configuration uses junctions that each have two vias, similar to the configuration of FIG. 6. The illustrated traces include not only the traces that form the global write lines, but also a global read line that carries the signal ldot. The trace associated with ldot (704) is formed in a third metal layer, m2, while the traces associated with wc and wt_b (702 and 701) are formed in layers m3 and m4.

The traces 701 and 702 are connected to traces 710 and 720, respectively, in the same manner as the corresponding traces of FIG. 6. That is, traces 701 and 702 include bumpouts (widened portions). The gap between traces 701 and 702 allows space for the bumpouts of junctions 780 and 790. The junctions (780, 790) between the traces each use two vias to connect the respective traces at the bumpouts. The configuration of FIG. 7, however, positions traces 701 and 702 two grid-spaces apart and positions the trace for the global read line ldot (704) on the grid line between traces 701 and 702. Trace 704 in layer M2 is aligned with the grid line in the gap. As noted above, trace 704 is formed in a metal layer (m4) that is separate from the layers (m2, m3) in which the traces for wc and wt_b are formed.

As with the configuration of FIG. 6, the use of two vias in each junction between traces of the global write lines in this configuration results in a smaller capacitance in the global write lines, which in turn can result in higher speeds and lower power consumption. It is estimated that the capacitance of the global write lines can be reduced by as much as 10% in a configuration such as the one shown in FIG. 7. By placing the trace for the global read line in the gap between the write lines as shown in FIG. 7, it is estimated that the capacitance of the read line can be reduced by as much as 3%, even if this line does not implement multiple-via junctions. These reductions in capacitance may in turn lead to as much as a 3% increase in memory speed, and as much as a 6% reduction in power.

It should be noted that the foregoing describes embodiments that are exemplary and are intended to be illustrative of the invention, rather than limiting. Alternative embodiments may include a number of variations on the details of these embodiments. For instance, while the foregoing embodiments use two standard vias in each junction, it may be possible to use more vias, or to obtain the same effect by using individual vias that are larger than standard vias (e.g., vias that are larger than the overlap of constant-width traces). Alternative embodiments may also utilize bumpouts on traces that are formed in different metal layers, or may position the bumpouts on opposite sides of the global write lines instead of between these lines. Still other variations may be apparent to those of skill in the art.

Those of skill will appreciate that the various illustrative logical blocks, modules, and circuits described in connection with the embodiments disclosed herein may be implemented in different ways using many different types of circuits and process technologies. Any combination of these device types and technologies is contemplated to be within the scope of the claims set forth below.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. An improvement to a memory system having a hierarchical bitline structure that includes a first global write line configured to carry a first global write signal and a second global write line configured to carry a second global write signal that is the inverse of the first global write signal, wherein the first global write line includes first and third traces and the second global write line includes second and fourth traces, wherein each of the first and second traces is formed in a first metal layer of an integrated circuit (IC) and each of the third and fourth traces is formed in a second metal layer of the IC which is different from the first metal layer, wherein the improvement comprises:
   at least one of the first and third traces having a widened portion that has sufficient overlap with the other of the first and third traces to accommodate at least two vias;
   at least two substantially adjacent vias connecting the first and third traces where the first and third traces overlap;
   wherein the first and third traces have a nominal width and wherein the widened portion is at least twice the nominal width.

2. The improvement of claim 1, wherein at least one of the second and fourth traces has a widened portion that has sufficient overlap with the other of the second and fourth traces to accommodate at least two vias, and wherein at least two substantially adjacent vias connect the second and fourth traces where the second and fourth traces overlap.

3. The improvement of claim 2, wherein the first, second, third and fourth traces have a nominal width and wherein the widened portions are at least twice the nominal width.

4. The improvement of claim 3, wherein each of the widened portions comprises a bumpout that extends perpendicularly from the corresponding trace.

5. The improvement of claim 4, wherein the first and second traces are parallel to each other and are separated by more than one maximum-density grid space, wherein the bumpouts are formed in the first and second traces, wherein the bumpout of the first trace extends toward the second trace, and wherein the bumpout of the second trace extends toward the first trace.

6. An improvement to a memory system having a hierarchical bitline structure that includes a first global write line configured to carry a first global write signal and a second global write line configured to carry a second global write signal that is the inverse of the first global write signal, wherein the first global write line includes first and third traces and the second global write line includes second and fourth traces, wherein each of the first and second traces is formed in a first metal layer of an integrated circuit (IC) and each of the third and fourth traces is formed in a second metal layer of the IC which is different from the first metal layer, wherein the improvement comprises:
   at least one of the first and third traces having a widened portion that has sufficient overlap with the other of the first and third traces to accommodate at least two vias;
   at least two substantially adjacent vias connecting the first and third traces where the first and third traces overlap;

wherein the first and second traces are parallel to each other and are separated by more than one maximum-density grid space.

7. The improvement of claim 6, wherein the first and second traces are separated by two maximum-density grid spaces.

8. The improvement of claim 7, further comprising a fifth trace configured to carry a global read signal, wherein the fifth trace is positioned between the first and second traces and is formed in a third metal layer of the IC which is different from the first and second metal layers.

9. The improvement of claim 1, wherein the first trace is connected to the gate of a first transistor that is connected between a bit line and ground, and the second trace is connected to the gate of a second transistor that is connected between the bit line and Vdd.

10. A memory system comprising:
a plurality of memory cells interconnected according to a hierarchical bitline structure;
a first global write line configured to carry a first global write signal, wherein the first global write line includes first and third traces; and
a second global write line configured to carry a second global write signal that is the inverse of the first global write signal, wherein the second global write line includes second and fourth traces;
wherein each of the first and second traces is formed in a first metal layer of an integrated circuit (IC) and each of the third and fourth traces is formed in a second metal layer of the IC which is different from the first metal layer;
wherein at least one of the first and third traces has a widened portion that has sufficient overlap with the other of the first and third traces to accommodate at least two vias, and wherein the first global write line includes at least two substantially adjacent vias connecting the first and third traces where the first and third traces overlap; and
wherein the first and third traces have a nominal width and wherein the widened portion is at least twice the nominal width.

11. The memory system of claim 10, wherein at least one of the second and fourth traces has a widened portion that has sufficient overlap with the other of the second and fourth traces to accommodate at least two vias, and wherein the second global write line includes at least two substantially adjacent vias connecting the second and fourth traces where the second and fourth traces overlap.

12. The memory system of claim 11, wherein the first, second, third and fourth traces have a nominal width and wherein the widened portions are at least twice the nominal width.

13. The memory system of claim 12, wherein each of the widened portions comprises a bumpout that extends perpendicularly from the corresponding trace.

14. The memory system of claim 13, wherein the first and second traces are parallel to each other and are separated by more than one maximum-density grid space, wherein the bumpouts are formed in the first and second traces, wherein the bumpout of the first trace extends toward the second trace, and wherein the bumpout of the second trace extends toward the first trace.

15. A memory system comprising:
a plurality of memory cells interconnected according to a hierarchical bitline structure;
a first global write line configured to carry a first global write signal, wherein the first global write line includes first and third traces; and
a second global write line configured to carry a second global write signal that is the inverse of the first global write signal, wherein the second global write line includes second and fourth traces;
wherein each of the first and second traces is formed in a first metal layer of an integrated circuit (IC) and each of the third and fourth traces is formed in a second metal layer of the IC which is different from the first metal layer;
wherein at least one of the first and third traces has a widened portion that has sufficient overlap with the other of the first and third traces to accommodate at least two vias, and wherein the first global write line includes at least two substantially adjacent vias connecting the first and third traces where the first and third traces overlap; and
wherein the first and second traces are parallel to each other and are separated by more than one maximum-density grid space.

16. The memory system of claim 15, wherein the first and second traces are separated by two maximum-density grid spaces.

17. The memory system of claim 16, further comprising a global read line configured to carry a global read signal, wherein the global read line includes a fifth trace which is positioned between the first and second traces and is formed in a third metal layer of the IC which is different from the first and second metal layers.

18. The memory system of claim 10, wherein the first trace is connected to the gate of a first transistor that is connected between a bit line and ground, and the second trace is connected to the gate of a second transistor that is connected between the bit line and Vdd.

* * * * *